United States Patent
Yue et al.

(10) Patent No.: US 12,394,619 B2
(45) Date of Patent: Aug. 19, 2025

(54) METAL OXIDE PRECLEAN FOR BOTTOM-UP GAPFILL IN MEOL AND BEOL

(71) Applicant: Applied Materials, Inc., Santa Clara, CA (US)

(72) Inventors: Shiyu Yue, Santa Clara, CA (US); Jiajie Cen, Santa Clara, CA (US); Sahil Jaykumar Patel, Sunnyvale, CA (US); Zhimin Qi, Santa Clara, CA (US); Ju Hyun Oh, San Jose, CA (US); Aixi Zhang, Santa Clara, CA (US); Xingyao Gao, Santa Jose, CA (US); Wei Lei, Santa Clara, CA (US); Yi Xu, San Jose, CA (US); Yu Lei, Belmont, CA (US); Tsung-Han Yang, San Jose, CA (US); Xiaodong Wang, San Jose, CA (US); Xiangjin Xie, Fremont, CA (US); Yixiong Yang, San Jose, CA (US); Kevin Kashefi, Dublin, CA (US); Rongjun Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 171 days.

(21) Appl. No.: 18/210,651

(22) Filed: Jun. 16, 2023

(65) Prior Publication Data
US 2024/0420947 A1 Dec. 19, 2024

(51) Int. Cl.
*H01L 21/02* (2006.01)
*H01L 21/311* (2006.01)

(52) U.S. Cl.
CPC .... *H01L 21/02046* (2013.01); *H01L 21/0206* (2013.01); *H01L 21/31111* (2013.01)

(58) Field of Classification Search
CPC .......... H01L 21/02046; H01L 21/0206; H01L 21/31111; H01L 21/02063; H01L 21/02068; H01L 21/32136
(Continued)

(56) References Cited

U.S. PATENT DOCUMENTS 7,273,808 B1 * 9/2007 Lin .................. H01L 21/76814
 438/622
10,354,916 B2 * 7/2019 Chen ................ H01L 21/31122
(Continued)

FOREIGN PATENT DOCUMENTS

JP 7194725 B2 12/2022
KR 20220149611 A 11/2022

OTHER PUBLICATIONS

International Search Report and Written Opinion dated Aug. 19, 2024 for Application No. PCT/US2024/025754.

*Primary Examiner* — Duy Vu N Deo
(74) *Attorney, Agent, or Firm* — Patterson + Sheridan, LLP (57) ABSTRACT

A method of pre-cleaning in a semiconductor structure includes performing a plasma pre-treatment process to remove impurities from a surface of a semiconductor structure comprising a metal layer and a dielectric layer, performing a selective etch process to remove molybdenum oxide from a surface of the metal layer, the selective etch process comprising soaking the semiconductor structure in a precursor including molybdenum chloride ($MoCl_5$, $MoCl_6$) at a temperature of between 250° C. and 350° C., and performing a post-treatment process to remove chlorine residues and by-products of the selective etch process on the surface of the semiconductor structure.

13 Claims, 5 Drawing Sheets

(58) Field of Classification Search
USPC .......................................................... 438/689
See application file for complete search history.

(56) References Cited

U.S. PATENT DOCUMENTS

| | | |
|---|---|---|
| 2020/0027785 A1 | 1/2020 | Roy et al. |
| 2020/0111675 A1* | 4/2020 | Takatsuki ................ C23C 16/54 |
| 2020/0176308 A1 | 6/2020 | Shen et al. |
| 2020/0227275 A1 | 7/2020 | Mullick et al. |
| 2023/0253308 A1* | 8/2023 | Chu .................. H01L 21/76871 |
| | | 257/774 |
| 2024/0038541 A1* | 2/2024 | Cen ..................... H01L 21/3065 |

* cited by examiner

METAL OXIDE PRECLEAN FOR BOTTOM-UP GAPFILL IN MEOL AND BEOL

BACKGROUND

Field

Embodiments described herein generally relate to semiconductor device fabrication. More specifically, embodiments of the present disclosure relate to methods for pre-cleaning a surface of a semiconductor device to selectively remove metal oxides, and reduce chlorine or fluorine residues.

Description of the Related Art

In fabrication of an integrated circuit, middle-end-of-line (MEOL) and back-end-of-line (BEOL) stages may include forming gate regions of transistors and local interconnect layers with molybdenum (Mo). Conventionally, a surface of a metal layer or a dielectric layer is pre-cleaned to remove metal oxides, such as molybdenum oxide ($MoO_x$) and tungsten oxide ($WO_x$), and reduce chlorine or fluorine residues from an etching process by a selective etch at a high temperature around 450° C. However, a selective etch at such high temperatures recesses an underlying metal layer undesirably, causing a bottom void in a BEOL process. Chlorine or fluorine residues that are not removed may degrade dielectric layers, which also leads to a short margin concern.

Therefore, there is a need for methods of selectively removing metal oxides, such as molybdenum oxide ($MoO_x$) and tungsten oxide ($WO_x$), without damaging an underlying layer and reducing chlorine or fluorine residues.

SUMMARY

Embodiments of the present disclosure provide a method of pre-cleaning in a semiconductor structure. The method includes performing a plasma pre-treatment process to remove impurities from a surface of a semiconductor structure comprising a metal layer and a dielectric layer, performing a selective etch process to remove molybdenum oxide and tungsten oxide from a surface of the metal layer, the selective etch process comprising soaking the semiconductor structure in a precursor including molybdenum chloride ($MoCl_5$, $MoCl_6$) at a temperature of between 250° C. and 450° C., and performing a post-treatment process to remove chlorine residues and by-products of the selective etch process on the surface of the semiconductor structure.

Embodiments of the present disclosure provide a method of pre-cleaning in a semiconductor structure. The method includes performing a plasma pre-treatment process to remove impurities from a surface of a semiconductor structure comprising a metal layer and a dielectric layer, performing a selective etch process to remove molybdenum oxide and tungsten oxide from a surface of the metal layer, the selective etch process comprising soaking the semiconductor structure in a precursor including tungsten chloride ($WCl_5$, $WCl_6$) at a temperature of between 250° C. and 450° C., and performing a post-treatment process to remove chlorine residues and by-products of the selective etch process on the surface of the semiconductor structure.

Embodiments of the present disclosure provide a method of pre-cleaning in a semiconductor structure. The method includes performing a selective etch process to remove molybdenum oxide and tungsten oxide from a surface of a semiconductor structure comprising a metal layer and a dielectric layer, the selective etch process comprising: soaking the semiconductor structure in a precursor including at least one of molybdenum chloride ($MoCl_5$, $MoCl_6$), tungsten chloride ($WCl_5$, $WCl_6$), tungsten fluoride ($WF_6$), and molybdenum fluoride ($MoF_6$) at a temperature of between 250° C. and 450° C., wherein the metal layer comprises molybdenum (Mo).

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to a low temperature selective etch process to selectively remove metal oxides, such as molybdenum oxide and tungsten oxide. At low temperature of between about 250° C. and about 450° C., for example, between about 250° C. and about 350° C., an etch selectivity of molybdenum oxide ($MoO_x$) to molybdenum (Mo) is more than 16 as compared to about 7 in a conventional selective etch process performed at about 450° C. A low temperature selective etch is also effective in reducing chlorine residues at a surface of a dielectric layer.

Processing System Example

Figure 1:
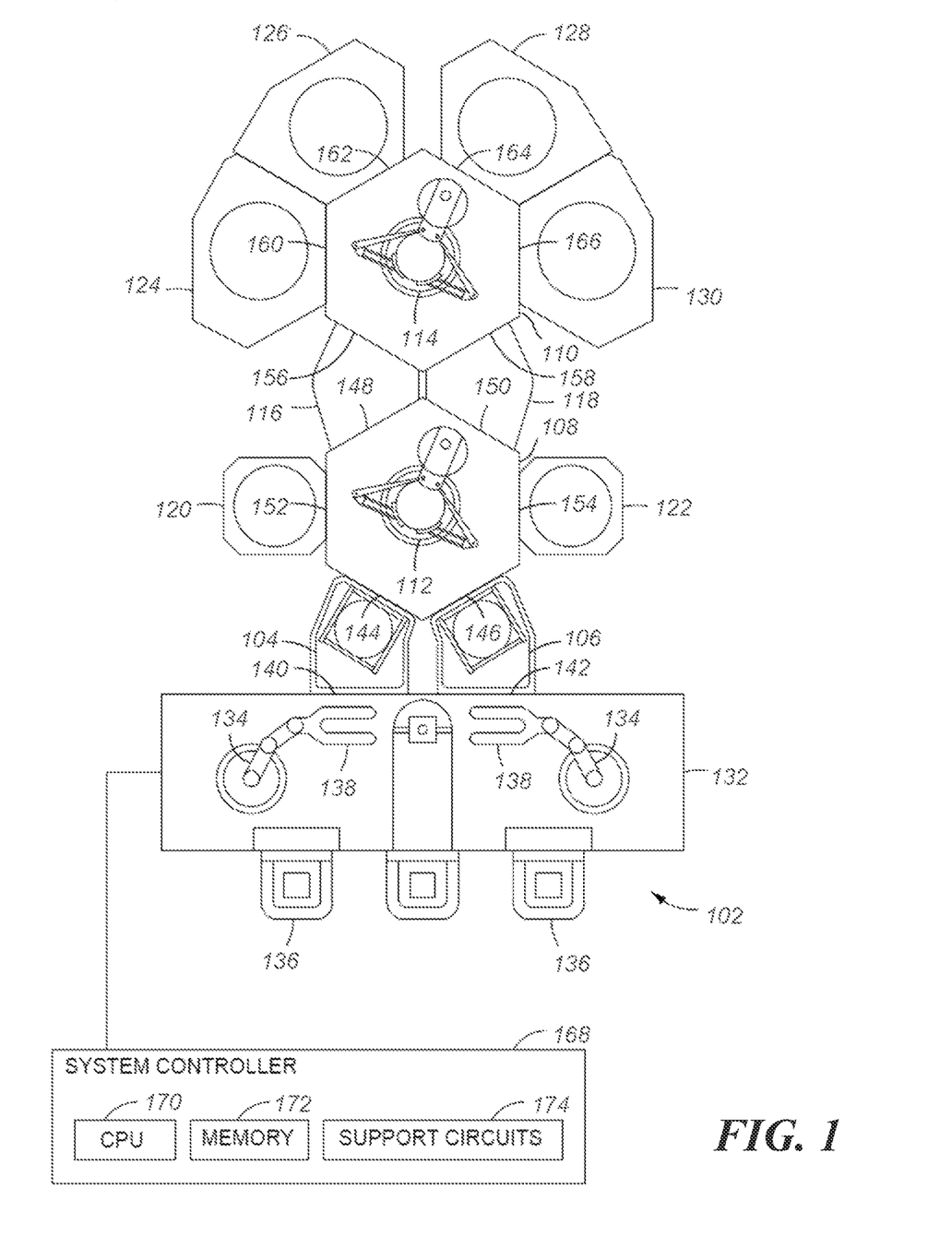
FIG. 1 is a schematic top view of a multi-chamber processing system, according to one or more embodiments of the present disclosure

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, and the processing chambers 126, 128, 130 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126, 128, or 130 may be a Centura™ Epi chamber, Volta™ CVD/ALD chamber, or Encore™ PVD chambers available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general-purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Example Semiconductor Structure to Pre-Clean

Fabrication of an integrated circuit may include three stages: front-end-of-line (FEOL), middle-end-of-line (MEOL), and back-end-of-line (BEOL) stages. The MEOL stage may include forming gate regions of the transistors and local interconnect layers proximate to the semiconductor substrate to connect the transistors. The BEOL stage may include forming metal interconnect layers to connect the transistors and other devices of the integrated circuit.

Figure 2A:
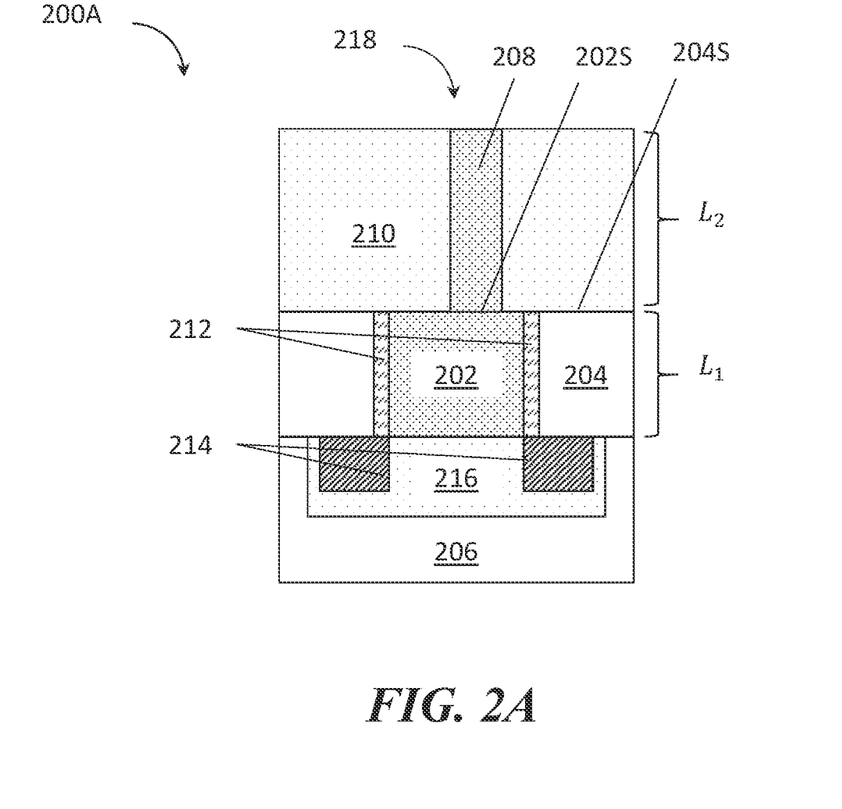
FIGS. 2A and 2B are schematic views of an exemplary semiconductor structure.
Figure 2B:
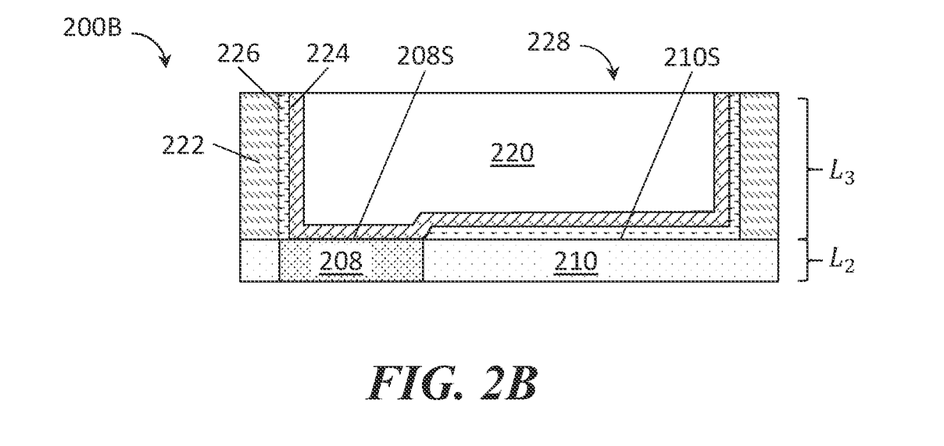

FIGS. 2A and 2B are schematic views of an exemplary semiconductor structure 200. FIG. 2A illustrates a MEOL portion 200A of the semiconductor structure. FIG. 2B illustrates a BEOL portion 200B of the semiconductor structure.

The MEOL portion 200A may include a first level $L_1$ that includes a metal layer 202 within a first dielectric layer 204 formed on a substrate 206, and a second level $L_2$ that includes an interconnect 208 within a second dielectric layer 210 formed on the first level $L_1$. In the first level $L_1$, liners 212 may be formed around the metal layer 202. The metal layer 202 and the interconnect 208 may be formed of molybdenum (Mo), tungsten (W), tungsten carbide (WC), or tungsten nitride (WN). The first dielectric layer 204 and the second dielectric layer 210 may be each formed of dielectric material such as silicon oxide ($SiO_2$), silicon nitride ($Si_3N_4$), or silicon oxynitride (SiON). The liners 212 may be formed of titanium nitride (TiN), tantalum nitride (TaN), or tungsten (W). The substrate 206 may include heavily doped regions 214 and a lightly doped region 216.

During the fabrication of the second level $L_2$, the semiconductor structure may be exposed to air or other oxidizing environment, and thus a surface of the metal layer 202 at an interface of the first level L and the second level $L_2$ may be oxidized. Further, an etching process to form a via 218 within the second dielectric layer 210 to form the interconnect 208 may also leave residues, such as chlorine residues or fluorine residues, at the interface of the first level $L_1$ and the second level $L_2$. A surface 202S of the metal layer 202 within the via 218 at the interface of the first level $L_1$ and the second level $L_2$ is therefore pre-cleaned prior to filling the via 218 from a bottom surface of the via 218 (the surface 202S of the metal layer 202) to form the interconnect 208.

The BEOL portion 200B may include the second level $L_2$ that includes the interconnect 208 formed within the second dielectric layer 210 and a third level $L_3$ that includes a metal layer 220 formed within a third dielectric layer 222. In the third level $L_3$, barrier layers 224 may be formed around the metal layer 220, and liners 226 may be formed around the barrier layers 224. The metal layer 220 may be formed of copper (Cu). The third dielectric layer 222 may be formed dielectric material such as silicon oxide ($SiO_2$), silicon nitride ($Si_3N_4$), or silicon oxynitride (SiON). The barrier layers 224 may be formed of titanium (Ti) or tantalum (Ta). The liners 226 may be formed of titanium nitride (TiN), tantalum nitride (TaN), or tungsten (W).

During the fabrication of the third level $L_3$, the semiconductor structure may be exposed to air or other oxidizing environment, and thus a surface of the interconnect 208 at an interface of the second level $L_2$ and the third level $L_3$ may be oxidized. Further, an etching process to form a trench 228 within the third dielectric layer 222 to form the metal layer 220 may also leave residues, such as chlorine residues or fluorine residues, at the interface of the second level $L_2$ and the third level $L_3$. A surface 208S of the interconnect 208 within the trench 228 at the interface of the second level $L_2$ and the third level $L_3$ is therefore pre-cleaned prior to filling the trench 228 from a bottom surface of the trench 228 (the surface 208S of the interconnect 208) to form the metal layer 220.

Pre-Clean

Figure 3:
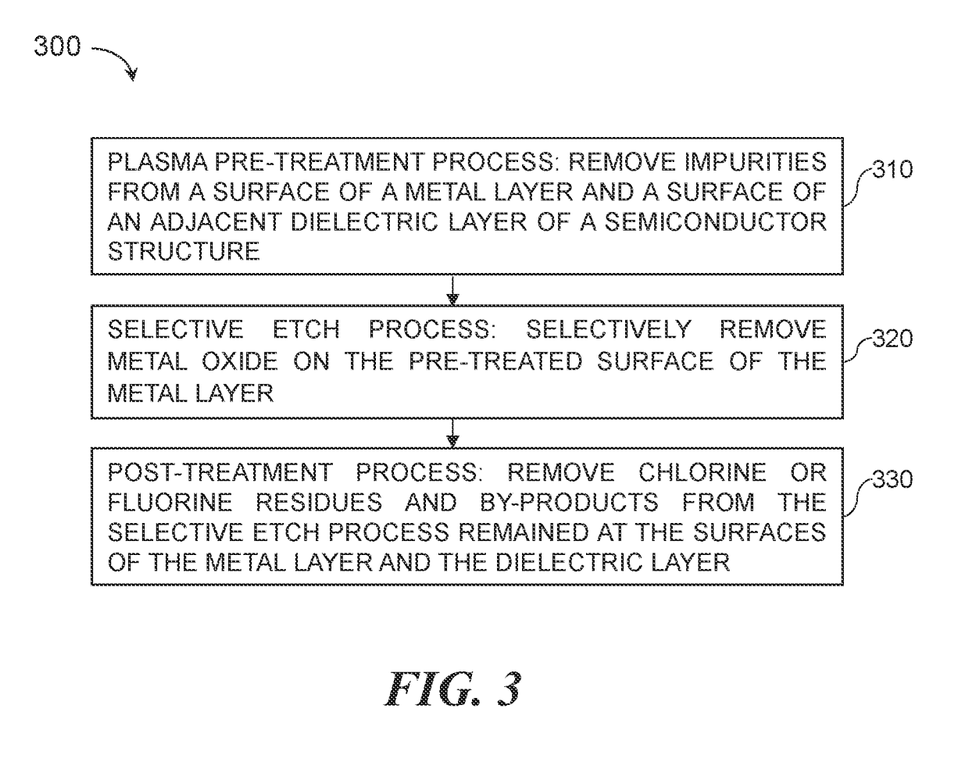
FIG. 3 depicts a process flow diagram of a method of metal oxide pre-clean for bottom-up molybdenum (Mo) gap-fill in MEOL and BEOL structures, according to one or more embodiments of the present disclosure.

FIG. 3 depicts a process flow diagram of a method 300 of metal oxide pre-clean for bottom-up molybdenum (Mo) gap-fill in MEOL and BEOL structures, according to one or more embodiments of the present disclosure. The method 300 can be used to pre-clean a metal surface such as the surface 202S of the metal layer 202 (e.g., molybdenum (Mo), tungsten (W), tungsten carbide (WC), or tungsten nitride (WN)) prior to filing the via 218 to form the interconnect 208 (e.g., molybdenum (Mo), tungsten (W), tungsten carbide (WC), or tungsten nitride (WN)) in the MEOL portion 200A shown in FIG. 2A, and to pre-clean a metal surface such as the surface 208S of the interconnect 208 (e.g., molybdenum (Mo)) prior to filling the trench 228 to form the metal layer 220 (e.g., molybdenum (Mo)) in the BEOL portion 200B shown in FIG. 2B.

The method 300 begins with block 310, in which a plasma pre-treatment process is performed to remove impurities from a surface of a metal layer (such as the surface 202S of the metal layer 202 or the surface 208S of the interconnect 208) and a surface of an adjacent dielectric layer (such as a surface 204S of the first dielectric layer 204 or a surface 210S of the second dielectric layer 210) of the semiconductor structure 200.

In some embodiments, the plasma pre-treatment process includes exposing the surface of the metal layer and the surface of the dielectric layer to a plasma formed from a process gas including both hydrogen ($H_2$)-containing gas and oxygen ($O_2$) gas. The plasma pre-treatment process may be an inductively coupled plasma (ICP) process performed in a processing chamber, such as Volta™ chamber available from Applied Materials of Santa Clara, Calif., or a capacitively coupled plasma (CCP) process performed in a processing chamber, such as Preclean XT chamber available from Applied Materials, Inc., of Santa Clara, Calif.

In some embodiments, the plasma pre-treatment process includes exposing the surface of the metal layer and the surface of the dielectric layer to a plasma formed from a process gas including hydrogen ($H_2$)-containing gas and a plasma formed from a process gas including oxygen ($O_2$) gas in sequence. The plasma pre-treatment process may be an inductively coupled plasma (ICP) process performed in a processing chamber, such as Volta™ chamber available from Applied Materials of Santa Clara, Calif., a capacitively coupled plasma (CCP) process performed in a processing chamber, such as Preclean XT chamber available from Applied Materials of Santa Clara, Calif., or a remote plasma assisted process performed in a processing chamber, such as Aktiv™ Preclean (APC) chamber available from Applied Materials of Santa Clara, Calif.

In block 320, a selective etch process is performed to selectively remove metal oxides, such as molybdenum oxide ($MoO_x$) (x=2 or 3) and tungsten oxide ($WO_x$), on the pre-treated surface of the metal layer.

The selective etch process to selectively remove metal oxides, such as molybdenum oxide ($MoO_x$) (x=2 or 3) and tungsten oxide ($WO_x$), over metals, such as molybdenum (Mo), tungsten (W), tungsten carbide (WC), or tungsten nitride (WN), is performed at a low temperature of between about 250° C. and about 450° C., for example, between about 250° C. and about 350° C., using a precursor including at least one of tungsten chloride ($WCl_5$, $WCl_6$), molybdenum chloride ($MoCl_5$, $MoCl_6$), tungsten fluoride ($WF_6$), and molybdenum fluoride ($MoF_6$). In the selective etch process, a semiconductor structure to be pre-cleaned is soaked in a precursor that is provided in a pulsing flow or a continuous flow in a processing chamber, such as the processing chamber 124, 126, 128, or 130 shown in FIG. 1.

Due to chemical reactions of metal oxides, such as molybdenum oxide ($MoO_x$) and tungsten oxide ($WO_x$), with a precursor (e.g., tungsten chloride ($WCl_5$, $WCl_6$), molybdenum chloride ($MoCl_5$, $MoCl_6$), tungsten fluoride ($WF_6$), molybdenum fluoride ($MoF_6$)) during the selective etch process, by-products such as $MoCl_x$ and $WCl_x$ in addition to chlorine residues or fluorine residues remain at the surfaces of the metal layer and the dielectric layer. Byproducts and chlorine or fluorine residues may degrade dielectric layers, which also lead to a short margin concern. In the subsequent step in block 330, the by-products and the chlorine or fluorine residues are removed.

Conventionally, a pre-clean process to selectively remove metal oxides, such as molybdenum oxide ($MoO_x$) (x=2 or 3) and tungsten oxide ($WO_x$), over metals, such as molybdenum (Mo), tungsten (W), tungsten carbide (WC), or tungsten nitride (WN), is performed at a higher temperature of about 450° C. Damages on dielectric layers and dielectric layers can be repaired. However, the precursor may act as a metal etcher at such high temperatures, recessing underlying metals undesirably. This recess may cause a bottom void in a BEOL process.

Figure 4A:
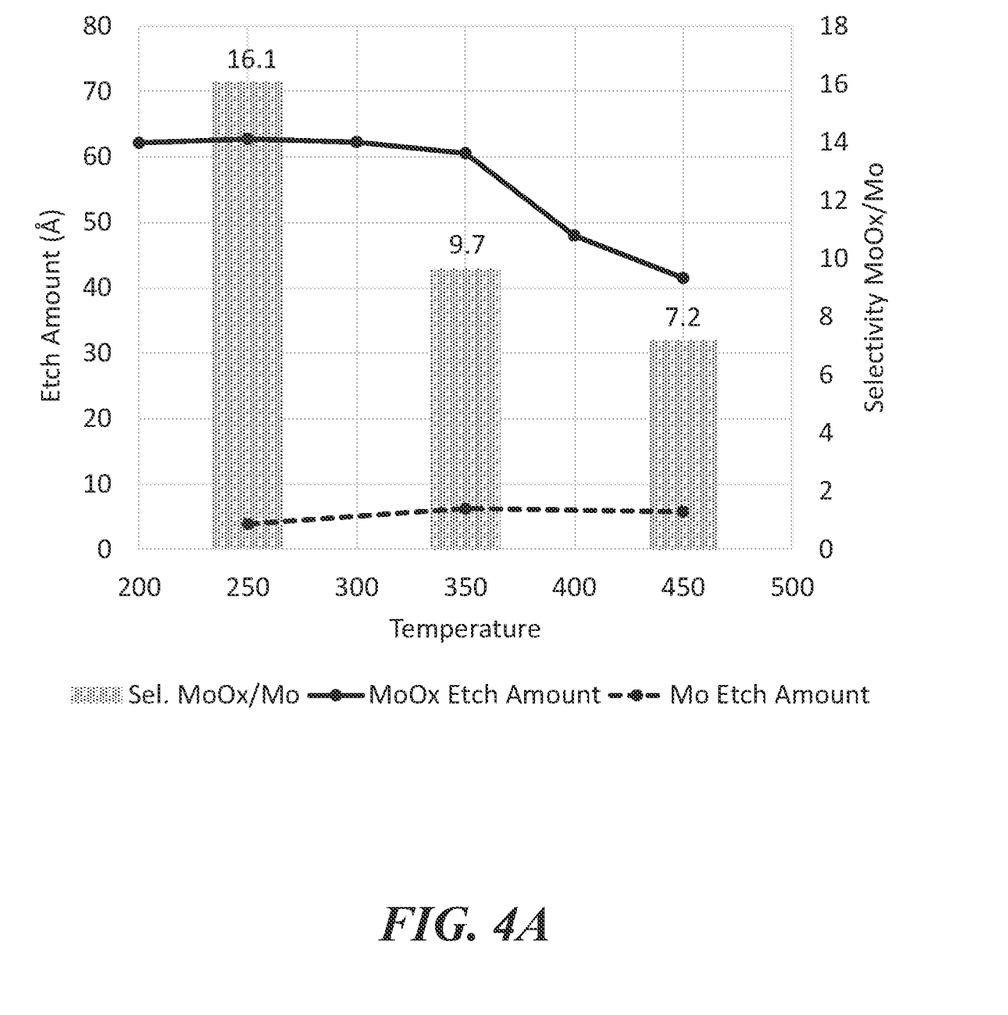
FIG. 4A illustrates an etch selectivity of molybdenum oxide ($MoO_x$) to molybdenum (Mo) by a selective etch process using a precursor including molybdenum (V) chloride ($MoCl_5$).

The inventors have discovered that an etch selectivity of molybdenum oxide ($MoO_x$) to molybdenum (Mo) can be significantly improved by a selective etch process at a lower temperature, and thus recessing of underlying metals can be avoided. For example, as shown in FIG. 4A, an etch selectivity of molybdenum oxide ($MoO_x$) to molybdenum (Mo) is 7.2 at 450° C., and increases to 9.7 at 350° C. and to 16.1 at 250° C., by a selective etch process using a precursor including molybdenum (V) chloride ($MoCl_5$). In FIG. 4A, a measured etch amount of molybdenum oxide ($MoO_x$) increases significantly as the temperature decreases from 450° C. to 350° C., and a measured etch amount of molybdenum (Mo) decreases slightly as the temperature decreases from 350° C. to 250° C. The inventors have observed similar increase of etch selectivity of molybdenum oxide ($MoO_x$) to molybdenum (Mo) in a selective etch process using a precursor including tungsten (V) chloride ($WCl_5$).

Figure 4B:
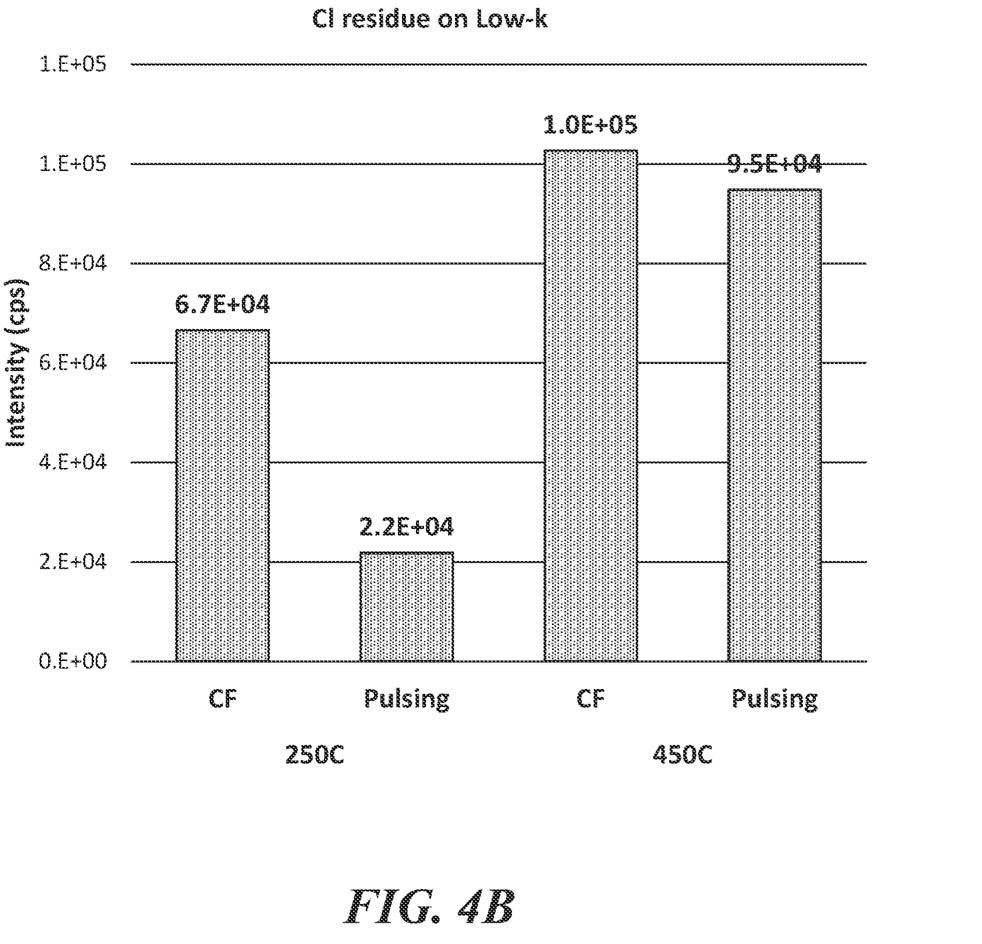
FIG. 4B illustrates amount of chlorine residues after a selective etch process.

The inventors have also discovered that chlorine residues at a surface of a dielectric layer can be reduced by a selective etch process at a lower temperature. For example, a surface X-ray photoelectron spectroscopy (XPS) at a dielectric substrate shown in FIG. 4B indicates much less chlorine residues are present after a selective etch process at 250° C. than by a selective etch process at 450° C. This reduction is more significant, for example, to about 20% of a selective etch process at 450° C., when a pulsing precursor is used, as compared to when a continuous flow (CF) precursor is used.

In block 330, a post-treatment process is performed to remove chlorine or fluorine residues and by-products (e.g., as $MoCl_x$ and $WCl_x$) from the selective etch process in block 320 remained at the surfaces of the metal layer and the dielectric layer.

In some embodiments, the post-treatment process includes a plasma post-treatment process in which the surface of the metal layer and the surface of the dielectric layer are exposed to a plasma formed from a process gas including hydrogen ($H_2$)-containing gas. The plasma post-treatment process may be an inductively coupled plasma (ICP) process performed in a processing chamber, such as Preclean XT chamber available from Applied Materials of Santa Clara, Calif., a capacitively coupled plasma (CCP) process performed in a processing chamber, such as Volta™ chamber available from Applied Materials of Santa Clara, Calif., a remote plasma assisted process performed in a processing chamber, such as Volta™ chamber, Aktiv™ Preclean (APC) chamber, or Preclean XTchamber available from Applied Materials of Santa Clara, Calif., a remote plasma cleaning (RPC) process, or a remote plasma lid (RPL) process. The plasma post-treatment may be a low energy ((e.g., less than about 50 eV) plasma treatment to protect the surface of the metal layer and the surface of the dielectric layer.

In some embodiments, the post-treatment process includes a thermal bake process in which the surface of the metal layer and the surface of the dielectric layer are heated to and maintained at a high temperature of between about 350° C. and about 450° C. while a hydrogen ($H_2$) containing or a moisture ($H_2O$) containing gas is flowed onto the surfaces. The thermal bake process may be performed at a high pressure of between about 10 Torr and about 300 Torr.

The remaining chlorine or fluorine residues may be further removed by hydrogen ($H_2$) based reduction pre-clean, an argon and inert-gas based sputter pre-clean, or a combination thereof.

Therefore, in the embodiments described herein, a pre-clean process to selectively remove metal oxides, such as molybdenum oxide ($MoO_x$) (x=2 or 3) and tungsten oxide ($WO_x$), over metals, such as molybdenum (Mo), tungsten (W), tungsten carbide (WC), or tungsten nitride (WN), is performed by a selective etch process at a low temperature of between about 250° C. and about 450° C., for example, between about 250° C. and about 350° C., using a precursor including at least one of molybdenum (V) chloride ($MoCl_5$), tungsten (V) chloride ($WCl_5$), tungsten fluoride ($WF_6$), and molybdenum fluoride ($MoF_6$).

At this temperature range, molybdenum oxide ($MoO_x$) and tungsten oxide ($WO_x$) can be fully removed without damaging an underlying surface. This low temperature soak process can be used to prepare a clean surface 202S of the metal layer 202 at the interface of the first level $L_1$ and the second level $L_2$ prior to filling the via 218 with metal to form the interconnect 208 or a clean surface 208S of the interconnect 208 at the interface of the second level $L_2$ and the third level $L_3$ prior to filling the trench 228 with metal to form the metal layer 220.

In the embodiments of the present disclosure, a low temperature selective etch process to selectively remove molybdenum oxide and tungsten oxide is provided. At low temperature of between about 250° C. and about 350° C., an etch selectivity of molybdenum oxide ($MoO_x$) to molybdenum (Mo) is more than 16 as compared to about 7 in a conventional selective etch process performed at about 450° C. A low temperature selective etch is also effective in reducing chlorine or fluorine residues at a surface of a dielectric layer.

We claim:

1. A method of pre-cleaning in a semiconductor structure, the method comprising:

performing a plasma pre-treatment process to remove impurities from a surface of the semiconductor structure comprising a metal layer and a dielectric layer, wherein the plasma pre-treatment process comprises exposing the surface of the semiconductor structure to a plasma formed from a process gas including hydrogen ($H_2$)-containing gas and a plasma formed from a process gas including oxygen ($O_2$) gas in sequence;

performing a selective etch process to remove molybdenum oxide from a surface of the metal layer, the selective etch process comprising soaking the semiconductor structure in a precursor including at least one of molybdenum chloride ($MoCl_5$ or $MoCl_6$) or tungsten chloride ($WCl_5$ or $WCl_6$) at a temperature of between 250° C. and 450° C.; and performing a post-treatment process to remove chlorine residues and by-products of the selective etch process on the surface of the semiconductor structure, wherein the post-treatment process comprises a capacitively coupled plasma (CCP) process, in which the surface of the semiconductor structure is exposed to a plasma formed from a hydrogen ($H_2$)-containing gas.

2. The method of claim 1, wherein an etch selectivity of molybdenum oxide ($MoO_x$) to molybdenum (Mo) is more than 16.

3. The method of claim 1, wherein the plasma pre-treatment process comprises an inductively coupled plasma (ICP) process, a capacitively coupled plasma (CCP) process, or a remote plasma assisted process.

4. A method of pre-cleaning in a semiconductor structure, the method comprising:

performing a plasma pre-treatment process to remove impurities from a surface of the semiconductor structure comprising a metal layer and a dielectric layer;

performing a selective etch process to remove molybdenum oxide from a surface of the metal layer, the selective etch process comprising soaking the semiconductor structure in a precursor including at least one of molybdenum chloride ($MoCl_5$ or $MoCl_6$) or tungsten chloride ($WCl_5$ or $WCl_6$) at a temperature of between 250° C. and 450° C.; and performing a post-treatment process to remove chlorine residues and by-products of the selective etch process on the surface of the semiconductor structure, wherein the post-treatment process comprises a thermal bake process, in which the surface of the semiconductor structure is heated to and maintained at a temperature of between 350° C. and 450° C.

5. The method of claim 4, wherein an etch selectivity of molybdenum oxide ($MoO_x$) to molybdenum (Mo) is more than 16.

6. The method of claim 4, wherein the plasma pre-treatment process comprises exposing the surface of the semiconductor structure to a plasma formed from a process gas including both hydrogen ($H_2$)-containing gas and oxygen ($O_2$) gas.

7. The method of claim 5, wherein the plasma pre-treatment process comprises an inductively coupled plasma (ICP) process or a capacitively coupled plasma (CCP) process performed.

8. The method of claim 4, wherein the plasma pre-treatment process comprises exposing the surface of the semiconductor structure to a plasma formed from a process gas including hydrogen ($H_2$)-containing gas and a plasma formed from a process gas including oxygen ($O_2$) gas in sequence.

9. The method of claim 8, wherein the plasma pre-treatment process comprises an inductively coupled plasma (ICP) process, a capacitively coupled plasma (CCP) process, or a remote plasma assisted process.

10. A method of pre-cleaning in a semiconductor structure, the method comprising:

performing a plasma pre-treatment process to remove impurities from a surface of the semiconductor structure, wherein the plasma pre-treatment process comprises:

an inductively coupled plasma (ICP) process, a capacitively coupled plasma (CCP) process, or a remote plasma assisted process, in which the surface of the semiconductor structure is exposed to a plasma formed from a process gas including hydrogen ($H_2$)-containing gas and a plasma formed from a process gas including oxygen ($O_2$) gas in sequence; and performing a selective etch process to remove molybdenum oxide from the surface of the semiconductor structure comprising a metal layer and a dielectric layer, the selective etch process comprising:

soaking the semiconductor structure in a precursor including at least one of molybdenum chloride ($MoCl_5$ or $MoCl_6$), tungsten chloride ($WCl_5$ or $WCl_6$), tungsten fluoride ($WF_6$), or molybdenum fluoride ($MoF_6$) at a temperature of between 250° C. and 450° C., wherein the metal layer comprises molybdenum (Mo).

11. The method of claim 10, wherein an etch selectivity of molybdenum oxide ($MoO_x$) to molybdenum (Mo) is more than 16.

12. The method of claim 10, further comprising:

performing a post-treatment process to remove chlorine residues and by-products of the selective etch process on the surface of the semiconductor structure, wherein the post-treatment process comprises a plasma process in which the surface of the semiconductor structure is exposed to a plasma formed from a hydrogen ($H_2$)-containing gas.

13. The method of claim 10, further comprising:

performing a post-treatment process to remove chlorine residues and by-products of the selective etch process on the surface of the semiconductor structure, wherein the post-treatment process comprises a thermal bake process in which the surface of the semiconductor structure is heated to and maintained at a temperature of between 350° C. and 450° C.

* * * * *